United States Patent
Kuo et al.

(10) Patent No.: US 9,111,851 B2
(45) Date of Patent: Aug. 18, 2015

(54) ENHANCEMENT MODE GALLIUM NITRIDE BASED TRANSISTOR DEVICE HAVING A P TYPE METAL OXIDE LAYER COMPRISING PLURALITY OF EXTENSION PARTS EXTENDING INTO THE EPITAXIAL STACKED LAYER

(71) Applicant: Industrial Technology Research Institute, Hsinchu (TW)

(72) Inventors: Wei-Hung Kuo, Hsinchu (TW); Suh-Fang Lin, Hsinchu (TW); Rong Xuan, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 133 days.

(21) Appl. No.: 13/686,935

(22) Filed: Nov. 28, 2012

(65) Prior Publication Data

US 2013/0168687 A1     Jul. 4, 2013

(30) Foreign Application Priority Data

Dec. 30, 2011   (TW) .............................. 100149705 A (51) Int. Cl.
*H01L 29/15* (2006.01)
*H01L 29/66* (2006.01)
(Continued)

(52) U.S. Cl.
CPC ...... *H01L 29/2003* (2013.01); *H01L 21/28264* (2013.01); *H01L 29/42316* (2013.01);
(Continued)

(58) Field of Classification Search
CPC .............. H01L 27/778; H01L 29/2003; H01L 29/42316

USPC ............ 257/76, 194, 201; 438/270, 172, 478, 438/285
See application file for complete search history.

(56) References Cited

U.S. PATENT DOCUMENTS 7,442,635 B2   10/2008   Das et al.
7,576,373 B1    8/2009   Hikita et al.
(Continued)

FOREIGN PATENT DOCUMENTS

| CN | 101246902 | 8/2008 |
| TW | 201220405 | 5/2012 |
| WO | 2009132039 | 10/2009 |

OTHER PUBLICATIONS

Chen et al, "Preparation and properties of p-type transparent conductive Cu-doped NiO films", Thin Solid Films 519 (2011), p. 4944-4947.*

(Continued)

*Primary Examiner* — Long K Tran
*Assistant Examiner* — Dzung Tran
(74) *Attorney, Agent, or Firm* — Jianq Chyun IP Office (57) ABSTRACT

Provided is an enhancement mode GaN-based transistor device including an epitaxial stacked layer disposed on a substrate; a source layer and a drain layer disposed on a surface of the epitaxial stacked layer; a p-type metal oxide layer disposed between the source layer and the drain layer; and a gate layer disposed on the p-type metal oxide layer. Besides, the p-type metal oxide layer includes a body part disposed on the surface of the epitaxial stacked layer, and a plurality of extension parts connecting the body part and extending into the epitaxial stacked layer. With such structure, the enhancement mode GaN-based transistor device can effectively suppress generation of the gate leakage current.

9 Claims, 6 Drawing Sheets

(51) Int. Cl.
*H01L 31/06* (2012.01)
*H01L 21/336* (2006.01)
*H01L 29/20* (2006.01)
*H01L 29/778* (2006.01)
*H01L 21/28* (2006.01)
*H01L 29/423* (2006.01)
*H01L 29/43* (2006.01)
*H01L 29/45* (2006.01)
*H01L 29/10* (2006.01)

(52) U.S. Cl.
CPC .......... *H01L29/432* (2013.01); *H01L 29/778* (2013.01); *H01L 29/7786* (2013.01); *H01L 29/1066* (2013.01); *H01L 29/452* (2013.01)

(56) References Cited

U.S. PATENT DOCUMENTS

| | | |
|---|---|---|
| 7,985,987 B2 | 7/2011 | Kaneko |
| 2005/0023555 A1* | 2/2005 | Yoshida et al. ............... 257/192 |
| 2009/0057720 A1* | 3/2009 | Kaneko ............... 257/194 |
| 2010/0148184 A1* | 6/2010 | Takehiko et al. ............... 257/76 |
| 2010/0155720 A1* | 6/2010 | Kaneko ............... 257/43 |
| 2011/0062438 A1* | 3/2011 | Kaneko ............... 257/43 |
| 2011/0068371 A1 | 3/2011 | Oka |
| 2011/0140121 A1 | 6/2011 | Lee et al. |
| 2011/0147795 A1* | 6/2011 | Rachmady et al. ............ 257/192 |
| 2011/0254055 A1* | 10/2011 | Sato et al. ............... 257/194 |

OTHER PUBLICATIONS

Lu et al., "High-Performance Integrated Dual-Gate AlGaN/GaN Enhancement-Mode Transistor," IEEE Electron Device Letters 31 (9), Sep. 2010, pp. 990-992.

Uemoto et al, "Gate Injection Transistor (GIT)-A Normally-Off AlGaN/GaN Power Transistor Using Conductivity Modulation," IEEE Transactions on Electron Devices 54 (12), Dec. 2007, pp. 3393-3399.

Roccaforte et al, "Epitaxial NiO gate dielectric on AlGaN/GaN heterostructures," Applied Physics Letters 100, Feb. 10, 2012, pp. 063511-1-063511-4.

Chiu et al, "Characterization of enhancement-mode AlGaN/GaN high electron mobility transistor using N2O plasma oxidation technology," Applied Physics Letters 99, Oct. 13, 2011, pp. 153508-1-153508-3.

Yanagihara et al., "Recent advances in GaN transistors for future emerging applications," Physica Status Solidi A 206 (6), Feb. 2, 2009, pp. 1221-1227.

Ganguly et al., "Presence and origin of interface charges at atomic-layer deposited Al2O3/lll-nitride heterojunctions," Applied Physics Letters 99, Nov. 9, 2011, pp. 193504-1-193504-3.

Xuan et al, "Enhancing threshold voltage of AlGan/GaN high electron mobility transistors by nano rod structure: From depletion mode to enhancement mode," Applied Physics Letters, 2012, pp. 112105.

Lee et al., "Novel of Normally-off GaN HEMT Device Structure by Using Nano-rods Technology," International Conference on Compound Semiconductor Manufacturing Technology, 2012.

\* cited by examiner

ENHANCEMENT MODE GALLIUM NITRIDE BASED TRANSISTOR DEVICE HAVING A P TYPE METAL OXIDE LAYER COMPRISING PLURALITY OF EXTENSION PARTS EXTENDING INTO THE EPITAXIAL STACKED LAYER

CROSS-REFERENCE TO RELATED APPLICATION

This application claims the priority benefit of Taiwan application serial no. 100149705, filed on Dec. 30, 2011. The entirety of the above-mentioned patent application is hereby incorporated by reference herein and made a part of this specification.

BACKGROUND

Technical Field

The technical field relates to an enhancement mode gallium nitride-based (GaN-based) transistor device.

BACKGROUND

In a conventional horizontal GaN-based high electron mobility transistor (HEMT) device with a two-dimensional electron gas (2DEG), the device cannot be normally off due to the 2DEG distribution of the gate region. It has been proposed that the 2DEG distribution of the gate region is destroyed to enhance the threshold voltage (Vt), but such method may lower the output current. It also has been proposed that a p-type AlGaN layer is formed in the gate region by a selectivity area growth. Using the characteristic of the depletion region, the 2DEG distribution below the gate region is depleted so that the device can be normally off. The turn-on current of such device is not much affected, but the threshold voltage of the same is generally lower because the threshold voltage (Vth) is limited by whether the p-type carrier concentration (about $1\times10^{17}/cm^2$) of the p-type AlGaN layer can effectively deplete the 2DEG. Therefore, attention is drawn to an enhancement mode hetero-structure field effect transistor (HFET) device in which the threshold voltage is improved but the turn-on current is not much affected.

SUMMARY

One of exemplary embodiments includes an enhancement mode GaN-based transistor device, which includes an epitaxial stacked layer having an undoped GaN layer disposed on a substrate; a source layer and a drain layer disposed on a surface of the epitaxial stacked layer; a p-type metal oxide layer disposed between the source layer and the drain layer; and a gate layer disposed on the p-type metal oxide layer. Besides, the p-type metal oxide layer includes a body part disposed on the surface of the epitaxial stacked layer, and a plurality of extension parts connecting the body part and extending into the epitaxial stacked layer.

One of exemplary embodiments includes an enhancement mode GaN-based transistor device, which includes an epitaxial stacked layer disposed on a substrate, including an undoped GaN layer and having a recess on a surface of the epitaxial stacked layer; a source layer and a drain layer disposed on the surface of the epitaxial stacked layer beside the recess; a plurality of p-type metal oxide layers disposed on the recess between the source layer and the drain layer and having different p-type carrier concentrations from each other; and a gate layer disposed on the p-type metal oxide layer.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
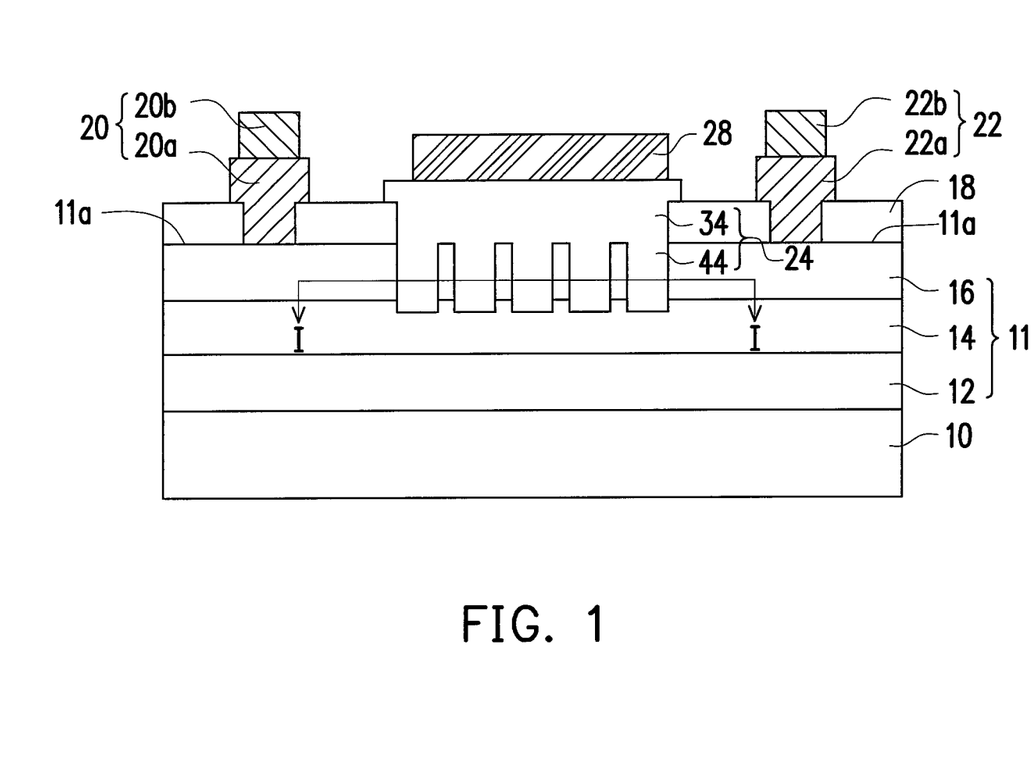
FIG. 1 is a schematic diagram illustrating a cross-sectional view of an enhancement mode GaN-based transistor device having a single-layer p-type metal oxide layer with extension parts according to a first embodiment.

FIG. 1 is a schematic diagram illustrating a cross-sectional view of an enhancement mode GaN-based transistor device having a single-layer p-type metal oxide layer with extension parts according to a first embodiment.

Referring to FIG. 1, the enhancement mode GaN-based transistor device of the first embodiment includes an epitaxial stacked layer 11, a source layer 20, a drain layer 22, a gate layer 28 and a p-type metal oxide layer 24. The source layer 20, the drain layer 22 and the p-type metal oxide layer 24 are disposed on the surface 11a of the epitaxial stacked layer 11. The gate layer 28 is disposed on the p-type metal oxide layer 24. The p-type metal oxide layer 24 is disposed between the source layer 20 and the drain layer 22. The p-type metal oxide layer 24 includes a body part 34 and a plurality of extension parts 44. The body part 34 is disposed on the surface 11a of the epitaxial stacked layer 11. The extension parts 44 connect the body part 34 and extend into the epitaxial stacked layer 11. The enhancement mode GaN-based transistor device further includes a dielectric layer 18 on the surface 11a of the epitaxial stacked layer 11.

The epitaxial stacked layer 11 is disposed on a substrate 10. The substrate 10 can be a silicon substrate, SiC substrate or a sapphire substrate. The epitaxial stacked layer 11 includes semiconductor, such as III-V compound semiconductor. For example, the epitaxial stacked layer 11 includes GaN. In the first embodiment, the epitaxial stacked layer includes a buffer layer 12, an undoped GaN layer (u-GaN layer) 14 and a barrier layer 16 sequentially stacked on the substrate 10, but the present disclosure is not limited thereto.

The buffer layer 12 can include III-V compound semiconductor. For example, the buffer layer 12 can be a GaN-based buffer layer or an AlN-based buffer layer. The forming method of the buffer layer 12 includes a metal-organic chemical vapour deposition (MOCVD) process or a molecular beam epitaxy (MBE) process. The thickness of the buffer layer 12 ranges, for example, from about 1 μm to about 10 μm. In an embodiment, the thickness of the buffer layer 12 can be about 4.2 μm.

The u-GaN layer 14 and the barrier layer 16 form a GaN hetero-structure with a two-dimensional electron gas. The forming method of the u-GaN layer 14 includes a MOCVD process or a MBE process, and the thickness of the same ranges, for example, from about 0.5 μm to about 5 μm. In an embodiment, the thickness of the u-GaN layer 14 can be about 1.6 μm. The barrier layer 16 can be an undoped $Al_xGa_{1-x}N$ layer (u-$Al_xGa_{1-x}N$ layer), wherein $0.1 \leq x \leq 1$. The u-$Al_xGa_{1-x}N$ layer has an aluminium content x of 20 to 30%. The forming method of the u-$Al_xGa_{1-x}N$ layer includes a MOCVD process or a MBE process, and the thickness of the same ranges, for example, from about 5 nm to about 40 nm. In an embodiment, the thickness of the barrier layer 16 can be about 20 nm.

The dielectric layer 18 is disposed on the epitaxial stacked layer 11. The dielectric layer 18 includes $SiO_2$, $Si_3N_4$ or $Si_3N_4/SiO_2$ and the forming method thereof includes a plasma-enhanced chemical vapour deposition (PECVD) process or a sputtering process. The thickness of the dielectric layer 18 ranges, for example, from about 10 nm to about 500 nm. The dielectric layer 18 defines the positions for the source layer 20, the drain layer 22 and the p-type metal oxide layer 24 (or the gate layer 28) with one or more photolithography-and-etching patterning processes.

A plurality of mesh holes, trenches or columns can be formed in the area, in which the p-type metal oxide layer 24 is subsequently formed, of the epitaxial stacked layer 11 with various patterning processes, so that the extension parts of the p-type metal oxide layer 24 can be subsequently formed into the epitaxial stacked layer 11. The depth of the mesh holes or trenches or the length of the columns ranges, for example, from 5 nm to 50 nm, and extends to the barrier layer 16 or the u-GaN layer 14. The size of the mesh holes, trenches or columns can be from 50 nm to 500 nm. In an embodiment, a nano-imprint process is performed on the dielectric layer 18 to form nano-mesh holes, nano-columns or nano-strips. Thereafter, a patterned photoresist layer which defines a gate region is formed with a photolithography process. Afterwards, an etching step is performed, in which $CHF_3$ gas is used to etch the dielectric layer 18, and a mixture gas including $SF_6$ and $Cl_2$ is then used until the etched depth reaches the barrier layer 16 or the u-GaN layer 14. Next, a buffered oxide etch (BOE) solution is used to remove the residual dielectric layer 18 in the gate region, and a $H_2SO_4/H_2O_2$ solution in a volume ratio of 2:1 is used to remove the residual photoresist layer outside of the gate region. In an embodiment, when the formed nano-mesh holes, nano-columns or nano-strips are deepened into the barrier layer 16, the depth thereof is about 15 nm. In another embodiment, when the formed nano-mesh holes, nano-columns or nano-strips are deepened into the u-GaN layer 14, the depth thereof is about 30 nm.

The source layer 20 and the drain layer 22 are disposed on the surface 11a of the epitaxial stacked layer 11 and on the dielectric layer 18. The source layer 20 includes an Ohmic metal electrode 20a and a metal electrode 20b. The drain layer 22 includes an Ohmic metal electrode 22a and a metal electrode 22b. Each of the Ohmic metal electrodes includes Ti (100 nm)/Al (300 nm), Ti (100 nm)/Al (300 nm)/Ni (40 nm)/Au (300 nm) or Ti (100 nm)/Al (300 nm)/Pt (40 nm)/Au (300 nm), but the disclosure is not limited thereto. Herein, for example, Ti (100 nm)/Al (300 nm) indicates a stacked layer including a titanium layer of 100 nm thick and an aluminum layer of 300 nm thick. The same rule can be applied to other cases. The Ohmic metal electrodes 20a and 22a of the source and drain layers 20 and 22 can be fabricated with an electron beam (e-beam) evaporation process followed by an annealing treatment. The annealing treatment can be a rapid thermal annealing (RTA) at 600° C. under nitrogen atmosphere for 1 minute. In an embodiment, the Ohmic metal electrodes 20a and 22a of the source and drain layers 20 and 22 can be fabricated, after the patterning of the dielectric layer 18 and before the formation of the p-type metal oxide layer 24, on the surface 11a of the epitaxial stacked layer 11 and on the dielectric layer 18. In another embodiment, the Ohmic metal electrodes 20a and 22a of the source and drain layers 20 and 22 can be fabricated, after the patterning of the dielectric layer 18 and the formation of the p-type metal oxide layer 24, on the surface 11a of the epitaxial stacked layer 11 and on the dielectric layer 18.

The forming method of the metal electrodes 20b and 22b of the source and drain layers 20 and 22 includes a photoresist lift off process and a selective evaporation process such as an e-beam evaporation. Each of the metal electrodes 20b and 22b of the source and drain layers 20 and 22 includes a high work function metal or an alloy, such as Ni (20 nm)/Au (300 nm), Ti (20 nm)/Au (300 nm) or Pt (20 nm)/Au (300 nm). The metal electrodes 20b and 22b of the source and drain layers 20 and 22 can be fabricated with an e-beam evaporation process followed by an annealing treatment. The annealing treatment can be a rapid thermal annealing (RTA) or a furnace annealing at 500° C. under nitrogen atmosphere for 1 minute to 30 minutes. The metal electrodes 20b and 22b of the source and drain layers 20 and 22 can be formed on the Ohmic metal electrodes 20a and 22a of the source and drain layers 20 and 22 after the formation of the p-type metal oxide layer 24.

Figure 1A:
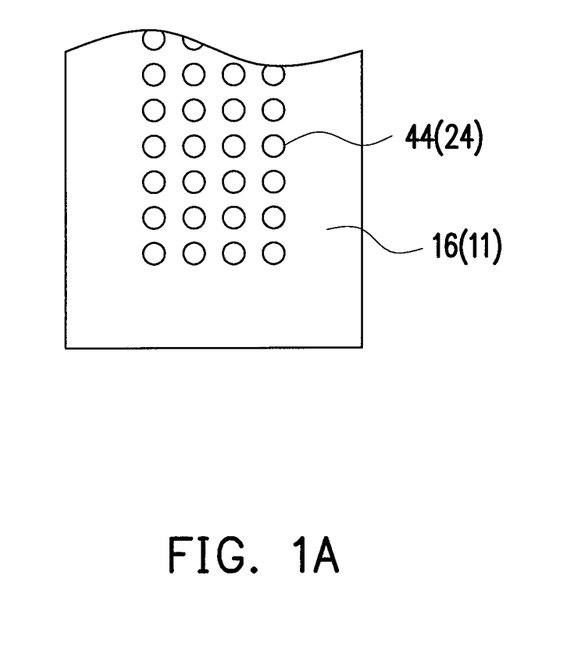
FIG. 1A is a top view along the line I-I of FIG. 1.
Figure 1B:
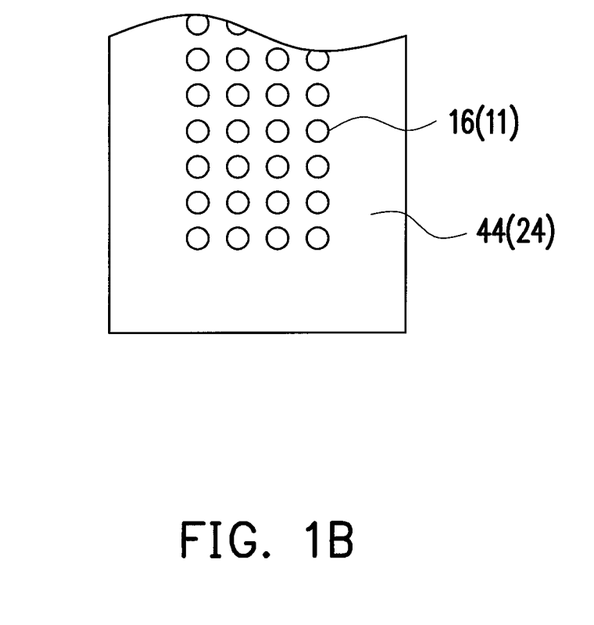
FIG. 1B is another top view along the line I-I of FIG. 1.

The p-type metal oxide layer 24 is disposed between the source and drain layers 20 and 22. The extension parts 44 of the p-type metal oxide layer 24 at least extend into the barrier layer 16. In an embodiment, the extension parts 44 of the p-type metal oxide layer 24 at least extend into the u-GaN layer 14, as shown in FIG. 1. In an embodiment, the epitaxial stacked layer 11 (or the barrier layer 16) has a plurality of mesh holes, and the extension parts 44 of the p-type metal oxide layer 24 are shaped as a plurality of columns respectively extending into the mesh holes, top view of which is shown in FIG. 1A. In another embodiment, the epitaxial stacked layer 11 (or the barrier layer 16) has a plurality of columns, and the extension parts 44 of the p-type metal oxide layer 24 extend into a space around the columns and are shaped as a mesh. Besides, the length of the p-type metal oxide layer 24 corresponds to the gate length.

The p-type metal oxide layer 24 has a p-type carrier concentration of $1\times10^{15}$ to $5\times10^{19}/cm^3$. The p-type metal oxide layer 24 includes multiple $NiO_y$ layers, and $1 \leq y \leq 1.2$. The p-type metal oxide layer 24 can be made of a single material layer, as shown in FIG. 1. The forming method of the p-type metal oxide layer 24 includes an atomic layer deposition (ALD) process, a vapour deposition process, a sputtering process, a chemical vapour deposition (CVD) process, a spraying method, a sol-gel method or a pulse laser deposition (PLD) process. The p-type metal oxide layer 24 can be formed after the formation of the dielectric layer 18 and before the formation of the gate layer 28 and the metal electrodes 20b and 22b of the source and drain layers 20 and 22.

The gate layer 28 is disposed on the p-type metal oxide layer 24. The gate layer 28 can be a metal electrode. The metal gate includes a high work function metal or an alloy, such as Ni (20 nm)/Au (300 nm), Ti (20 nm)/Au (300 nm) or Pt (20 nm)/Au (300 nm). The length of the gate layer 28 is about 2 μm, for example. In an embodiment, the forming method of the gate layer 28 includes a photoresist lift off process and a selective evaporation process. The step of forming the gate layer 28 can be simultaneously performed during the step of forming the metal electrodes 20b and 22b of the source and drain layers 20 and 22.

Besides, an $Al_2O_3$ layer or another metal oxide layer can be used instead of the p-type metal oxide layer 24 of the said embodiments.

Figure 2:
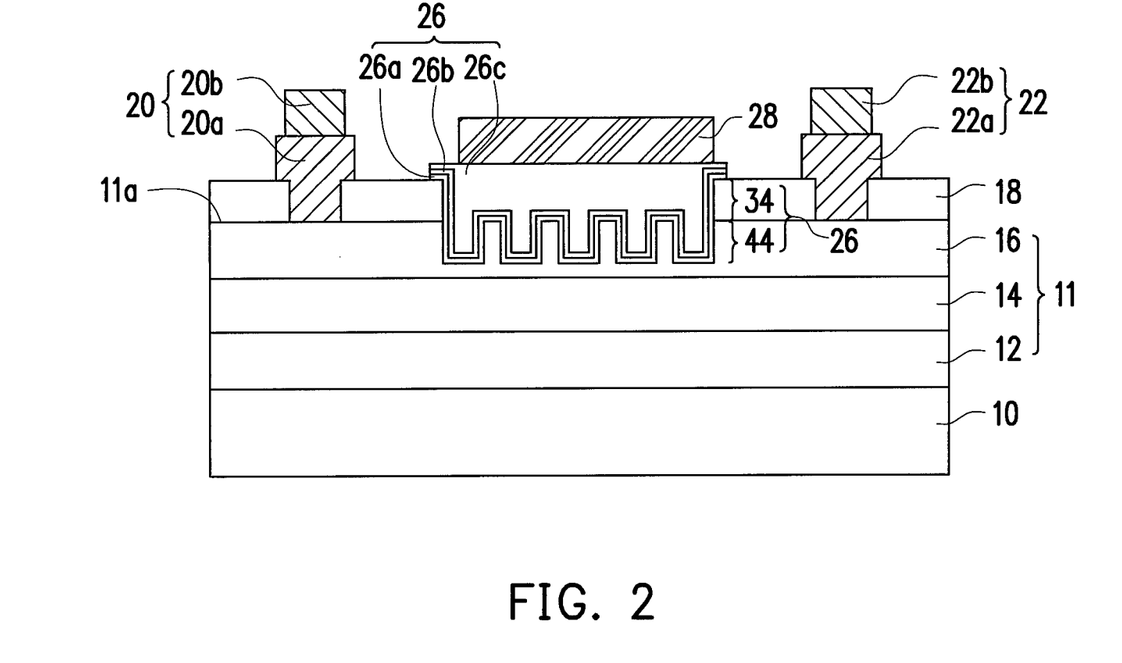
FIG. 2 is a schematic diagram illustrating a cross-sectional view of an enhancement mode GaN-based transistor device having a multi-layer p-type metal oxide layer with extension parts according to a second embodiment.

FIG. 2 is a schematic diagram illustrating a cross-sectional view of an enhancement mode GaN-based transistor device having a multi-layer p-type metal oxide layer with extension parts according to a second embodiment.

In the first embodiment, the enhancement mode GaN-based transistor device has a single-layer p-type metal oxide layer 24 with extension parts. However, the present disclosure is not limited thereto. In the second embodiment, the enhancement mode GaN-based transistor device has a multi-layer p-type metal oxide layer 26 with extension parts, as shown in FIG. 2.

The p-type metal oxide layer 26 can include a plurality of p-type metal oxide layers 26a-26c with different p-type carrier concentrations. In an embodiment, the p-type metal oxide layer 26 is made of multiple $NiO_y$ layers with different p-type carrier concentrations, in which one $NiO_y$ layer has a p-type carrier concentration of less than $1\times10^{15}/cm^3$, another $NiO_y$ layer has a p-type carrier concentration of $1\times10^{15}$ to $1\times10^{17}/cm^3$, yet another $NiO_y$ layer has a p-type carrier concentration of more than $1\times10^{17}/cm^3$, and each of the $NiO_y$ layers has a thickness of 1 nm to 200 nm. The forming method of the multi-layer p-type metal oxide layer 26 includes an atomic layer deposition (ALD) process, a vapour deposition process, a sputtering process, a chemical vapour deposition (CVD) process, a spraying method, a sol-gel method or a pulse laser deposition (PLD) process. The multi-layer p-type metal oxide layer 26 can be formed after the formation of the dielectric layer 18 and before the formation of the gate layer 28 and source and drain layers 20 and 22.

The above embodiments in which the enhancement mode GaN-based transistor device having a single-layer or multi-layer p-type metal oxide layer with extension parts is provided for illustration purposes and is not construed as limiting the present disclosure. The third embodiment discloses a recessed enhancement mode GaN-based transistor device having a multi-layer p-type metal oxide layer.

Figure 3:
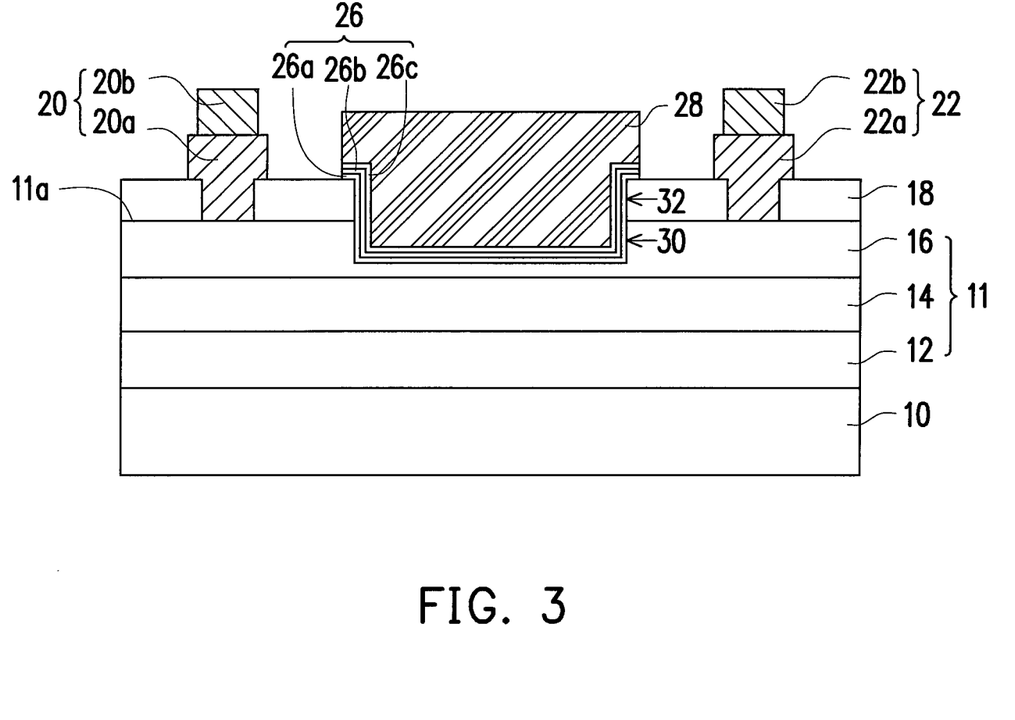
FIG. 3 is a schematic diagram illustrating a cross-sectional view of a recessed enhancement mode GaN-based transistor device having a multi-layer p-type metal oxide layer according to a third embodiment.

FIG. 3 is a schematic diagram illustrating a cross-sectional view of a recessed enhancement mode GaN-based transistor device having a multi-layer p-type metal oxide layer according to a third embodiment.

Referring to FIG. 3, the enhancement mode GaN-based transistor device of the third embodiment includes an epitaxial stacked layer 11, a source layer 20, a drain layer 22, a gate layer 28 and a p-type metal oxide layer 26. The epitaxial stacked layer 11 has a recess 30, which corresponds to the gate layer 28, on the surface 11a thereof. In the third embodiment, the epitaxial stacked layer includes a buffer layer 12, an undoped GaN layer (u-GaN layer) 14 and a barrier layer 16 sequentially stacked on the substrate 10, but the present disclosure is not limited thereto. The bottom of the recess 30 can expose the barrier layer 16 or the u-GaN layer 14. The source layer 20 and the drain layer 22 are disposed on the surface 11a of the epitaxial stacked layer 11. The gate layer 28 is disposed on the p-type metal oxide layer 24, corresponds to the recess 30 of the epitaxial stacked layer 11, and located between the source and drain layers 20 and 22. The multi-layer p-type metal oxide layer 26 including p-type metal oxide layers 26a-26c is disposed between the source and drain layers 20 and 22 and on the recess 30 of the epitaxial stacked layer 11. In an embodiment, the multi-layer p-type metal oxide layer 26 is disposed on the recess 30 of the epitaxial stacked layer 11 and extends, along the sidewall of the opening 32 of the dielectric layer 18, onto a portion of the surface of the dielectric layer 18.

The material and forming method of the multi-layer p-type metal oxide layer 26 of the third embodiment are similar to those described in the second embodiment, and the materials and forming methods of other components or layers are similar to those described in the first embodiment, so that the details are not iterated herein.

In the following Examples 1-3, the substrate 10 is a silicon substrate, and the epitaxial stacked layer 11 includes a GaN-based buffer layer 12 of 4.2 μm thick, an u-GaN layer 14 of 1.6 μm thick and an u-AlGaN layer 16 of 1.6 μm thick, wherein the u-AlGaN layer 16 has an aluminum content of 25%. The dielectric layer 18 is a $SiO_2$ layer of 300 nm thick formed through PECVD. An etching step is performed, in which $CHF_3$ gas is used to etch the dielectric layer 18, and a mixture gas including $SF_6$ and $Cl_2$ is then used until the etched depth reaches the barrier layer 16 or the u-GaN layer 14. Next, a buffered oxide etch (BOE) solution is used to remove the residual dielectric layer 18 in the gate region, and a $H_2SO_4$/$H_2O_2$ solution in a volume ratio of 2:1 is used to remove the residual photoresist layer outside of the gate region. The Ohmic metal electrodes 20a and 22a of the source and drain layers 20 and 22 include Ti (100 nm)/Al (300 nm), and the forming method thereof include performing an e-beam evaporation process at 600° C. under nitrogen atmosphere for 1 minute. The metal electrodes 20b and 22b of the source and drain layers 20 and 22 include Ni (20 nm)/Au (300 nm), and the forming method thereof include performing an e-beam evaporation process.

EXAMPLE 1

An epitaxial stacked layer 11 is grown on a substrate 10. A dielectric layer 18 is formed on the epitaxial stacked layer 11. Thereafter, an nano-imprint process is performed on the dielectric layer 18 to form a nanoporous pattern having a pitch of 450 nm, a pore size of 225 nm and a thickness of 150 nm. The gate region is then defined with a photolithography process. Afterwards, an etching step is performed to the dielectric layer 18 and downward to the u-GaN layer 14 of the epitaxial stacked layer 11, so as to form a plurality of mesh holes or columns having a total depth of 30 nm and a total length of about 2 μm corresponding to the gate length. Next, an $Al_2O_3$ layer of 10 nm thick is deposited on the gate region with an ALD process. The $Al_2O_3$ layer is then patterned to form a metal oxide layer (in the same position of the p-type metal oxide layer 24 of FIG. 1). Thereafter, source and drain regions are defined through a photolithography process and followed by an etching of the dielectric layer 18. Ohmic metal electrodes 20a and 22a of source and drain layers 20 and 22 are then evaporated, and metal electrodes 20b and 22b of the source and drain layers 20 and 22 are formed through a photoresist lift off process and followed by a selective evaporation process.

Figure 4:
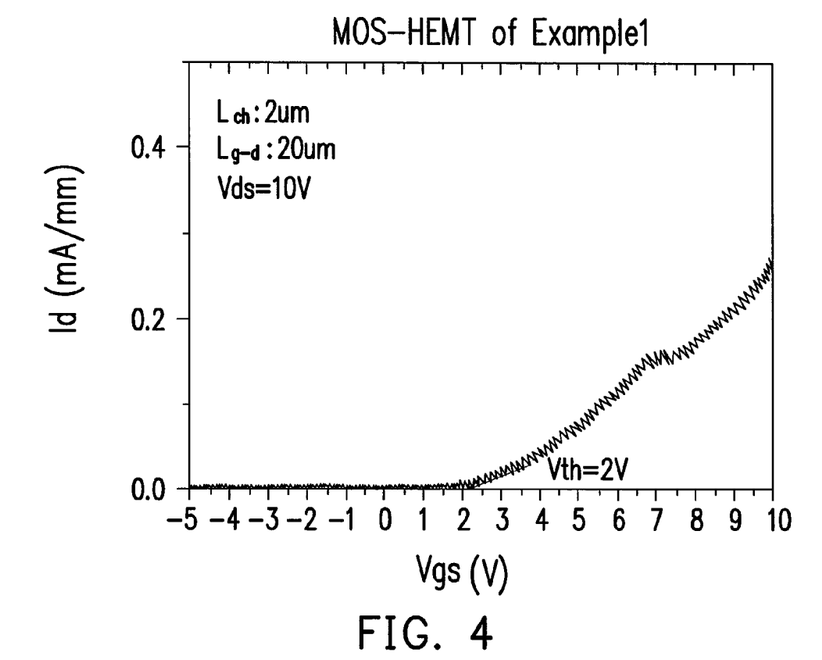
FIG. 4 shows the current decay performance of the MOS-HEMT device structure of Example 1 in which the gate region has a nanoporous pattern.
Figure 5:
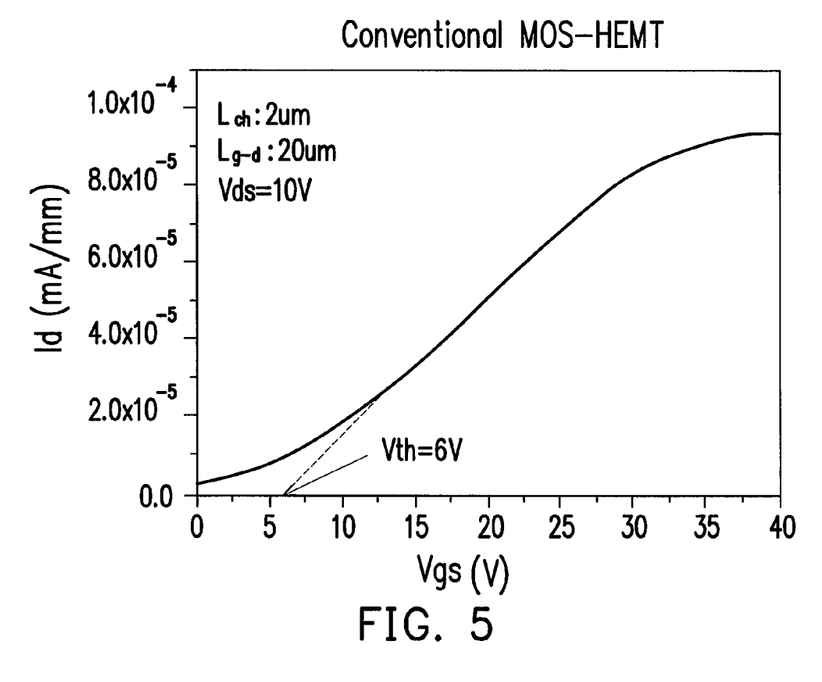
FIG. 5 shows the current decay performance of the conventional MOS-HEMT.

Example 1 is a MOS-HEMT device structure in which the gate region has a nanoporous pattern. The current decay performance of the MOS-HEMT of Example 1 is shown in FIG. 4, while the current decay performance of the conventional MOS-HEMT is shown in FIG. 5. From the results of FIG. 4 and FIG. 5, the turn on current (Id) at gate voltage (Vgs) of 10 V of the MOS-HEMT of Example 1 is $3 \times 10^{-1}$ A/mm, and the turn on current (Id) at gate voltage (Vgs) of 10 V of the conventional MOS-HEMT is $2 \times 10^{-5}$ A/mn, and the ratio is about $1.5 \times 10^{4}$. Apparently, the MOS-HEMT of Example 1 in which the gate region has a nanoporous pattern is capable of significantly suppressing the current decay.

EXAMPLE 2

An epitaxial stacked layer 11 is grown on a substrate 10. A dielectric layer 18 is formed on the epitaxial stacked layer 11. Thereafter, source and drain regions are defined through a photolithography process and followed by an etching of the dielectric layer 18. Ohmic metal electrodes 20a and 22a of source and drain layers 20 and 22 are then evaporated.

Afterwards, the gate region is then defined with a photolithography process. Afterwards, an etching step is performed to the dielectric layer 18 and downward to the u-AlGaN layer 16 of the epitaxial stacked layer 11, and a total depth of the etching step is 15 nm. An e-beam evaporation process is performed with Ni and $NiO_x$ as a traget and an $O_2$ flow rate of 5 sccm, so as to form a p-type $NiO_y$ layer of 50 nm thick, wherein each of x and y is more than 1, and the p-type $NiO_y$ layer has a p-type carrier concentration of less than $1 \times 10^{15}/cm^3$. Next, a gate layer 28 and metal electrodes 20b and 22b of the source and drain layers 20 and 22 are formed through a photoresist lift off process and followed by a selective evaporation process.

Figure 6:
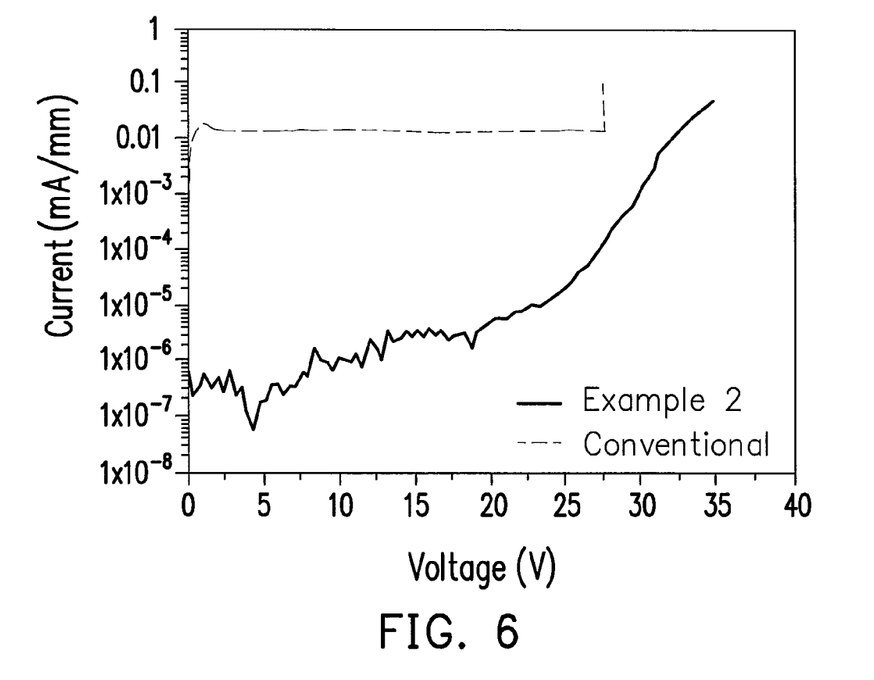
FIG. 6 shows the gate leakage current of each of the transistor having a recessed gate of Example 2 and the conventional transistor having a recessed Schottky gate.

FIG. 6 shows the gate leakage current of each of the transistor having a recessed $NiO_y$ gate of Example 2 and the conventional transistor having a recessed Schottky gate. The result of FIG. 6 indicates that the gate leakage current of the transistor of Example 2 is lower than the conventional transistor having a recessed Schottky gate by $1 \times 10^3$. Apparently, the transistor device structure of Example 2 can suppress the gate leakage current at a low p-type carrier concentration ($<1 \times 10^{15}/cm^3$).

EXAMPLE 3

An epitaxial stacked layer 11 is grown on a substrate 10. A dielectric layer 18 is formed on the epitaxial stacked layer 11. Thereafter, source and drain regions are defined through a photolithography process and followed by an etching of the dielectric layer 18. Ohmic metal electrodes 20a and 22a of source and drain layers 20 and 22 are then evaporated. Afterwards, the gate region is then defined with a photolithography process. Next, an etching step is performed to the dielectric layer 18 and downward to the u-AlGaN layer 16 of the epitaxial stacked layer 11, and a total depth of the etching step is 15 nm.

An e-beam evaporation process is performed with Ni as a traget, an $O_2$ flow rate of 9 sccm and a chamber temperature of 250° C., so as to form a $NiO_y$ layer of 250 nm thick, wherein y is more than 1. The sample is then transferred out and put in a RTA furnace at 500° C. under $N_2$ (100 sccm) for 1 minute, wherein y is more than 1 and the p-type $NiO_y$ layer has a p-type carrier concentration of less than $1 \times 10^{16}/cm^3$. Next, a gate layer 28 and metal electrodes 20b and 22b of the source and drain layers 20 and 22 are formed through a photoresist lift off process and followed by a selective evaporation.

Figure 7:
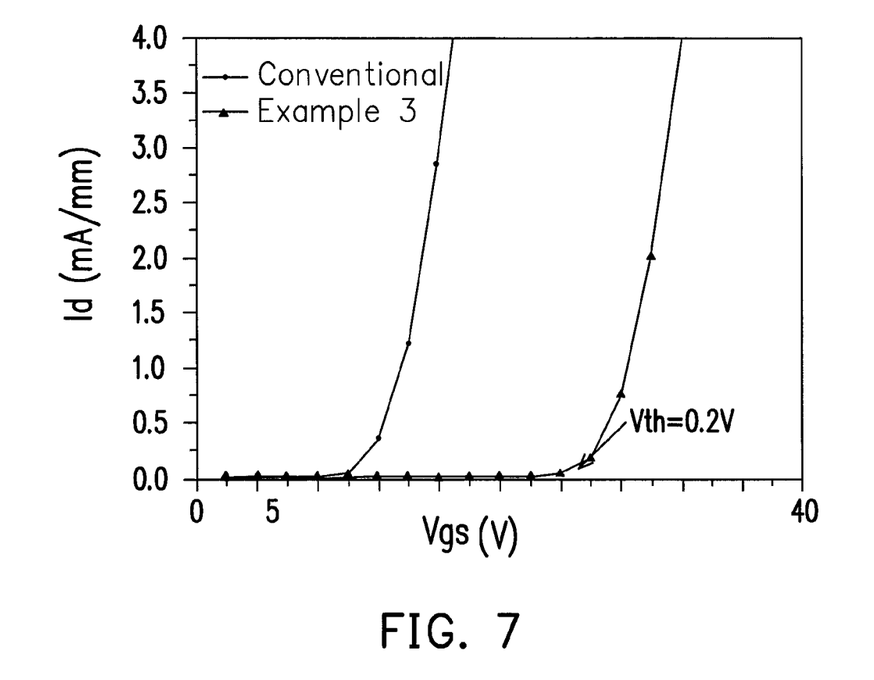
FIG. 7 shows the transfer I-V characteristic curve of each of the transistor having a recessed gate of Example 3 and the conventional transistor having a recessed Schottky gate.

FIG. 7 shows the transfer I-V characteristic curve of each of the transistor having a recessed $NiO_y$ gate of Example 3 and the conventional transistor having a recessed Schottky gate. The result of FIG. 7 indicates that the transistor of Example 3 has a threshold voltage (Vth) of 0.2 V and can be a normally off device. As compared to the conventional transistor having a recessed Schottky gate, the transistor of Example 3 with such a p-type carrier concentration can effectively enhance the threshold voltage (Vth).

EXAMPLE 4

An epitaxial stacked layer 11 is grown on a substrate 10. The epitaxial stacked layer 11 includes a GaN-based buffer layer 12 of about 1-10 μm thick, an u-GaN layer 14 of about 1-5 μm thick and an u-AlGaN layer 16 of about 5-40 μm thick, wherein the aluminum content of the u-AlGaN layer 16 is 25%. Thereafter, a dielectric layer 18 is formed on the epitaxial stacked layer 11. The dielectric layer 18 can be a $SiO_2$ layer, a $Si_3N_4$ layer or a $Si_3N_4/SiO_2$ layer. The dielectric layer 18 is deposited with a PECVD process or a sputtering process, and the thickness thereof is 10-500 nm.

Thereafter, a nano-pattern including a plurality of nano-strips, nano-columns, nano-rods or nano-pores is formed on the dielectric layer 18 with an e-beam lithography process or an nano-imprint process, and the minimum width of the nano-pattern is 50-500 nm.

A gate region is defined through a photolithography process, and then an etching step is performed, in which $CHF_3$ gas is used to etch the dielectric layer 18, and a mixture gas including $SF_6$ and $Cl_2$ is then used until the etched depth reaches the barrier layer 16 (with a total depth of 15 nm) or the u-GaN layer 14 (with a total depth of 30 nm), wherein the gate length (Lg) is 1-10 μm.

Thereafter, source and drain regions are defined through a photolithography process and followed by an etching of the dielectric layer 18. Ohmic metal electrodes 20a and 22a of source and drain layers 20 and 22 are then formed with an e-beam evaporation process or a sputtering process. The Ohmic metal electrodes 20a and 22a includes Ti (100 nm)/Al (300 nm), Ti (100 nm)/Al (300 nm)/Ni (40 nm)/Au (300 nm) or Ti (100 nm)/Al (300 nm)/Pt (40 nm)/Au (300 nm). A rapid thermal annealing (RTA) treatment is performed thereto at 600-1000° C. under nitrogen atmosphere for 1 minute.

Thereafter, as a p-type metal oxide layer 26, multiple $NiO_y$ layers with different p-type carrier concentrations are formed with an atomic layer deposition (ALD) process, a vapour deposition process, a sputtering process, a chemical vapour deposition (CVD) process, a spraying method, a sol-gel method or a pulse laser deposition (PLD) process, wherein y is more than 1. In the multiple $NiO_y$ layers, one $NiO_y$ layer has a p-type carrier concentration of less than $1 \times 10^{15}/cm^3$, another $NiO_y$ layer has a p-type carrier concentration of $1 \times 10^{15}$ to $1 \times 10^{17}/cm^3$, yet another $NiO_y$ layer has a p-type carrier concentration of more than $1 \times 10^{17}/cm^3$, and each of the $NiO_y$ layers has a thickness of 1 nm to 200 nm. Next, a gate layer 28 and metal electrodes 20b and 22b of the source and drain layers 20 and 22 are formed through a photoresist lift off process and followed by a selective evaporation process. For example, a metal layer is formed with an e-beam evaporation process, and an annealing treatment is performed thereto. The annealing treatment includes a rapid thermal annealing or a furnace annealing is performed at 500° C. under nitrogen atmosphere for 1 minute to 30 minutes. The resulting transistor structure is shown in FIG. 2.

In the enhancement mode GaN-based hetero-structure field effect transistor device of the disclosure, a p-type metal oxide layer having multiple extension parts is formed in the gate region. With such structure, the device can be normally off, i.e., the threshold voltage (Vth) is greater than zero. Meanwhile, the turn on current of such device is not much affected, i.e., the 2DEG concentration is not much influenced. A wider process window is also provided. In addition, multiple layers with different p-type carrier concentrations are formed as a p-type metal oxide layer can effectively suppress generation of the gate leakage current.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An enhancement mode GaN-based transistor device, comprising:
    an epitaxial stacked layer, disposed on a substrate and comprising an undoped GaN layer, the epitaxial stacked layer having a continuous pattern and comprising a plurality of mesh holes separated from one another;
    a source layer and a drain layer, disposed on a surface of the epitaxial stacked layer;
    a p-type metal oxide layer, disposed between the source layer and the drain layer and comprising:
        one body part, disposed on the surface of the epitaxial stacked layer; and
        a plurality of extension columns, the extension columns being separated from one another, wherein the extension columns extend into the mesh holes of the epitaxial stacked layer from the body part, and the extension columns are in contact with and surrounded by the epitaxial stacked layer; and
    a gate layer, disposed on the p-type metal oxide layer.

2. The enhancement mode GaN-based transistor device of claim 1, wherein the epitaxial stacked layer comprises:
    a buffer layer;
    the undoped GaN layer, disposed on the buffer layer; and
    a barrier layer, disposed on the undoped GaN layer.

3. The enhancement mode GaN-based transistor device of claim 2, wherein the buffer layer comprises a GaN-based buffer layer or an AlN-based buffer layer.

4. The enhancement mode GaN-based transistor device of claim 2, wherein the barrier layer comprises an undoped $Al_xGa_{1-x}N$ layer, and $0.1 \leq x \leq 1$.

5. The enhancement mode GaN-based transistor device of claim 2, wherein the extension parts of the p-type metal oxide layer at least extends into the barrier layer.

6. The enhancement mode GaN-based transistor device of claim 2, wherein the extension parts of the p-type metal oxide layer at least extends into the undoped GaN layer.

7. The enhancement mode GaN-based transistor device of claim 1, wherein the p-type metal oxide layer comprises a $NiO_y$ layer having a p-type carrier concentration of $1 \times 10^{15}$ to $5 \times 10^{19}/cm^3$, and $1 \leq y \leq 1.2$.

8. The enhancement mode GaN-based transistor device of claim 1, wherein the p-type metal oxide layer comprises a plurality of $NiO_y$ layers with different p-type carrier concentrations, and $1 \leq y \leq 1.2$, and wherein one $NiO_y$ layer has a p-type carrier concentration of less than $1 \times 10^{15}/cm^3$, another $NiO_y$ layer has a p-type carrier concentration of $1 \times 10^{15}$ to $1 \times 10^{17}/cm^3$, and yet another $NiO_y$ layer has a p-type carrier concentration of more than $1 \times 10^{17}/cm^3$.

9. The enhancement mode GaN-based transistor device of claim 1, further comprising a dielectric layer disposed between the p-type metal oxide layer and the source layer and between the p-type metal oxide layer and the drain layer.

* * * * *